United States Patent
Huang

(10) Patent No.: US 12,401,122 B2
(45) Date of Patent: Aug. 26, 2025

(54) NFC APPARATUS, ELECTRONIC DEVICE, AND SIGNAL PROCESSING METHOD

(71) Applicant: GUANGDONG OPPO MOBILE TELECOMMUNICATIONS CORP., LTD., Guangdong (CN)

(72) Inventor: Wuxin Huang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 415 days.

(21) Appl. No.: 18/076,004

(22) Filed: Dec. 6, 2022

(65) Prior Publication Data

US 2023/0107933 A1  Apr. 6, 2023

Related U.S. Application Data

(63) Continuation of application No. PCT/CN2021/091524, filed on Apr. 30, 2021.

(30) Foreign Application Priority Data

Jun. 8, 2020 (CN) .......................... 202010511580.6
Jun. 8, 2020 (CN) .......................... 202021038569.4

(51) Int. Cl.
*H04B 5/00* (2024.01)
*H01Q 7/00* (2006.01)
*H04B 5/26* (2024.01)

(52) U.S. Cl.
CPC ............... *H01Q 7/00* (2013.01); *H04B 5/266* (2024.01)

(58) Field of Classification Search
CPC .......... H04B 5/72; H04B 5/00; H04B 5/0031; H01Q 7/00
See application file for complete search history.

(56) References Cited

U.S. PATENT DOCUMENTS

2009/0195324 A1  8/2009  Li et al.
2011/0128088 A1*  6/2011  Jin .......................... H03H 7/38
                                                        333/25
(Continued)

FOREIGN PATENT DOCUMENTS

CN    101040404 A    9/2007
CN    104508945 A    4/2015
(Continued)

OTHER PUBLICATIONS

International Search Report and Written Opinion with English Translation for PCT/CN2021/091524 mailed Jul. 21, 2021 (18 pages).

(Continued)

*Primary Examiner* — Tuan H Nguyen
(74) *Attorney, Agent, or Firm* — Young Basile Hanlon & MacFarlane, P.C.

(57) ABSTRACT

Described are a NFC apparatus, an electronic device and a signal processing method. The NFC apparatus includes a NFC controller, a NFC antenna, and a balanced to unbalanced converter. The balanced-to-unbalanced converter comprises a primary coil and a secondary coil. The primary coil is connected to the NFC controller. Coupled to the primary coil, the secondary coil is connected to the NFC antenna. The balanced-to-unbalanced converter is configured to convert a first current signal in the form of a pair of differential signals generated by the NFC controller to a second current signal in the form of a single-ended signal received by the NFC antenna, and amplify a magnitude of the first current signal to a magnitude of the second current signal through a coupling relationship with a ratio between a first impedance of the primary coil and a second impedance of the secondary coil as N:1.

18 Claims, 7 Drawing Sheets

(56) References Cited

U.S. PATENT DOCUMENTS

2016/0175024 A1    6/2016   Yates et al.
2018/0269929 A1*   9/2018   Ding ...................... H01Q 1/242

FOREIGN PATENT DOCUMENTS

| CN | 108205636 A | 6/2018 |
|----|-------------|--------|
| CN | 108632794 A | 10/2018 |
| CN | 109088657 A | 12/2018 |
| CN | 208284311 U | 12/2018 |
| CN | 212969639 U | 4/2021 |

OTHER PUBLICATIONS

Chinese First Office Action with English Translation for Chinese Application No. 202010511580.6, mailed Jun. 21, 2023 (16 pages).
Extended European Search Report for EP Application 21822364.2 mailed Oct. 30, 2023. (13 pages).

\* cited by examiner

NFC APPARATUS, ELECTRONIC DEVICE, AND SIGNAL PROCESSING METHOD

CROSS-REFERENCE TO RELATED APPLICATION(S)

The present disclosure is a continuation application of International Patent Application No. PCT/CN2021/091524, filed on Apr. 30, 2021, which claims priority to Chinese patent application No. 202010511580.6, filed on Jun. 8, 2020, and to Chinese patent application No. 202021038569.4, filed on Jun. 8, 2020, the entire contents of all of which are incorporated herein by reference.

TECHNICAL FIELD

The present disclosure relates to the technology field of wireless communication, in particular to a Near Field Communication (NFC) apparatus, an electronic device, and a signal processing method.

BACKGROUND

With the development and rapid change of communication technology, various modes of communication are gradually evolved. An NFC technology based on contactless radio frequency Identification (RFID) gradually becomes a common communication method in people's daily life with its convenient communication method and wide adaptability. Currently, an NFC antenna in a conventional NFC apparatus has low radiation strength, causing poor performance of the NFC antenna.

SUMMARY

A technical solution adopted in the present disclosure is to provide a near field communication (NFC) apparatus. The NFC apparatus includes an NFC controller, an NFC antenna, and a balanced-to-unbalanced converter. The NFC controller is configured to generate a first current signal in a form of a pair of differential signals. The NFC antenna is configured to convert a second current signal in a form of a single-ended signal to a target electro-magnetic signal. The balanced-to-unbalanced converter comprises a primary coil and a secondary coil. The primary coil is connected to the NFC controller. The secondary coil is coupled to the primary coil and connected to the NFC antenna. A ratio between a first impedance of the primary coil and a second impedance of the secondary coil is N:1. N is a real number greater than 1. The balanced-to-unbalanced converter is configured to convert the first current signal in the form of a pair of differential signals to the second current signal in the form of a single-ended signal, and amplify a magnitude of the first current signal to a magnitude of the second current signal through a coupling relationship with the ratio between the first impedance of the primary coil and the second impedance of the secondary coil as N:1.

Another technical solution adopted in the present disclosure is to provide an electronic device. The electronic device includes a near field communication (NFC) apparatus. The NFC apparatus includes an NFC controller, an NFC antenna, and a balanced-to-unbalanced converter. The NFC controller is configured to generate a first current signal in a form of a pair of differential signals. The NFC antenna is configured to convert a second current signal in a form of a single-ended signal to a target electro-magnetic signal. The balanced-to-unbalanced converter comprises a primary coil and a secondary coil. The primary coil is connected to the NFC controller. The secondary coil is coupled to the primary coil and connected to the NFC antenna. A ratio between a first impedance of the primary coil and a second impedance of the secondary coil is N:1; N is a real number greater than 1. The balanced-to-unbalanced converter is configured to convert the first current signal in the form of a pair of differential signals to the second current signal in the form of a single-ended signal, and amplify a magnitude of the first current signal to a magnitude of the second current signal through a coupling relationship with the ratio between the first impedance of the primary coil and the second impedance of the secondary coil as N:1.

In addition, a signal processing method applied in the NFC apparatus mentioned above is provided in the present disclosure. The method includes: generating the first current signal through the NFC controller; amplifying the magnitude of the first current signal through the coupling relationship with the ratio between the first impedance of the primary coil and the second impedance of the secondary coil as N:1 in the balanced-to-unbalanced converter to obtain the second current signal; converting the second current signal into the target electro-magnetic signal through the NFC antenna.

DETAILED DESCRIPTION

In order to understand the features and technical contents in embodiments of the present disclosure in more detail, in conjunction with the accompanying drawings, the following is a detailed description in the embodiments of the present disclosure, which are for illustrative purposes only and are not intended to limit the embodiments of the present disclosure.

When terms such as "first\second" appear in the present disclosure, the following description is given. In the following description, the terms "first\second" are only to distinguish similar objects, and do not represent a specific order for the objects. It is understood that the terms "first\second" may, when in appropriate cases, be interchanged in a particular order or sequence so that the embodiments of the present disclosure described herein may be implemented in an order other than that illustrated or described herein.

Unless otherwise defined, all technical and scientific terms used in the embodiments of the present disclosure indicates the same meaning as commonly understood by those skilled in the art belonging to the present disclosure. The terms used in the embodiments of the present disclosure are intended only for the purpose of describing the embodiments of the present disclosure and are not intended to limit the present disclosure.

Currently, the design solutions for NFC apparatus are divided into two main categories, which are a differential design solution and a single-ended design solution based on a balanced to unbalanced method.

Figure 1:
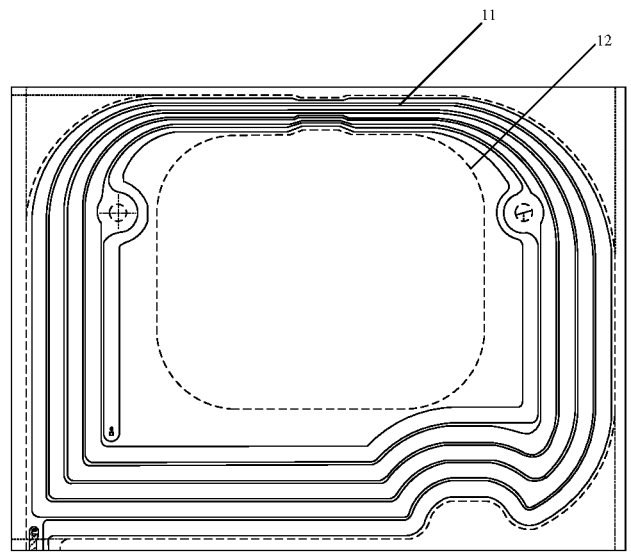
FIG. 1 is a structural schematic view of an NFC apparatus based on a differential design solution according to some embodiments of the present disclosure.

Referring to FIG. 1, FIG. 1 is a structural schematic view of an NFC apparatus based on a differential design solution according to some embodiments of the present disclosure. In the embodiments, an NFC antenna in the NFC apparatus is mainly implemented by an assembly consisting of a flexible printed circuit (FPC) coil 11 and a ferrite core 12. The FPC coil 11 is configured to excite the magnetic induction lines and the ferrite core 12 is configured for magnetic conduction.

Figure 2:
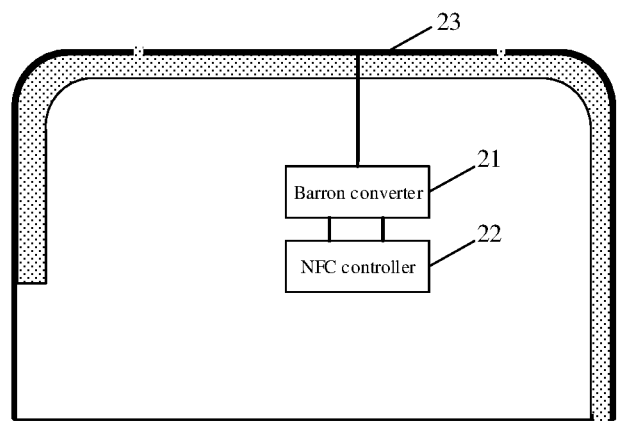
FIG. 2 is a structural schematic view of an NFC apparatus in a single-ended design solution based on a balanced to unbalanced method according to some embodiments of the present disclosure.

Further, referring to FIG. 2, FIG. 2 is a structural schematic view of an NFC apparatus in a single-ended design solution based on a balanced to unbalanced method according to some embodiments of the present disclosure. In the embodiments, a pair of differential signals output from an NFC controller 22 is converted to a single-ended signal by a balanced-to-unbalanced converter (e.g., a differential-to-single-ended converter named Balun converter) 21, and the single-ended signal is transmitted to an NFC antenna 23, which transmits the single-ended signal through the NFC antenna 23.

In practical applications, the NFC antennas in the above NFC apparatuses have the problems of small magnetic flux, weak radiation strength, and poor NFC antenna performance.

Figure 3:
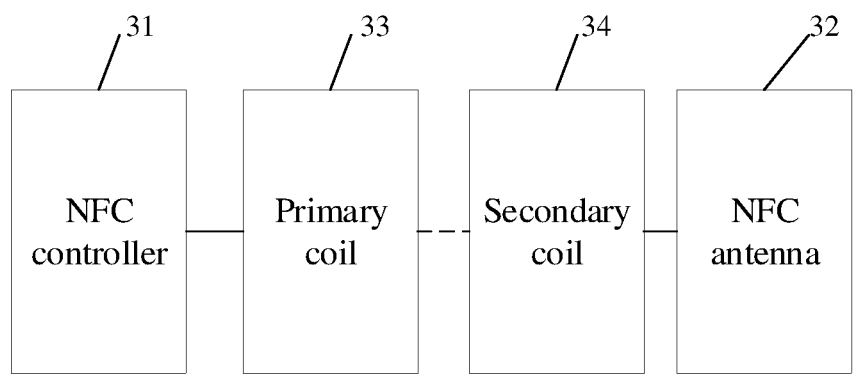
FIG. 3 is a first schematic view of a structural composition of an NFC apparatus according to some embodiments of the present disclosure.

Based on above, some embodiments of the present disclosure provide an NFC apparatus. Referring to FIG. 3, FIG. 3 is a first schematic view of a structural composition of an NFC apparatus according to some embodiments of the present disclosure. In the embodiments, the NFC apparatus includes: an NFC controller 31, an NFC antenna 32 and a balanced-to-unbalanced converter 21. The balanced-to-unbalanced converter 21 includes a primary coil 33 and a secondary coil 34.

The NFC controller 31 is connected to the primary coil 33; the NFC antenna 32 is connected to the secondary coil 34; the primary coil 33 is coupled to the secondary coil 34.

The NFC controller 31 is configured to control the NFC antenna 32 to perform a near field communication through a coupling relationship between the primary coil 33 and the secondary coil 34.

A ratio between a first impedance of the primary coil 33 and a second impedance of the secondary coil 34 is N:1; N is a real number greater than 1.

In some embodiments of the present disclosure, the NFC apparatus is configured to generate a first current through the NFC controller 31 and amplify a magnitude of the first current signal through the coupling relationship between the primary coil 33 and the secondary coil 34 to obtain a second current signal. The second current signal is converted to a target electro-magnetic signal through the NFC antenna 32.

The NFC apparatus referred to in the embodiments of the present disclosure may be implemented by a combination of hardware and software, which may be integrated in an electronic device and called by a Central Processing Unit (CPU) of the electronic device. Further, the electronic device may be a smartphone, a Personal Digital Assistant (PDA), a tablet computer, a personal computer, an in-vehicle terminal, or a wearable device, etc. The type of the electronic device is not limited by the embodiments of the present disclosure.

In some embodiments of the president disclosure, the NFC controller 31 is configured to control the NFC antenna 32 to achieve various operating modes of NFC communication. Among them, NFC communication includes three operating modes, which are a reader/writer mode, a peer-to-peer mode (P2P mode), and a card emulation mode. The following is a brief introduction to each of the three operating modes of NFC communication.

I Reader/writer mode: The NFC apparatus may be configured as a contactless reader, for example, the NFC apparatus may read relevant information from electronic tags of posters or exhibition information. The NFC apparatus may further realize data exchange with electronic devices configured with NFC function.

II Peer-to-peer mode (P2P mode): This mode is similar to infrared communication technology and Bluetooth communication technology. The NFC apparatus may be configured to exchange data with other NFC apparatuses. The key to this mode is to connect two NFC apparatuses so that data transmission between peers and peers may be achieved.

III Card emulation mode: In this mode, the NFC apparatus may be emulated as a tag or a contactless card, for example, a cell phone supporting the NFC function may be configured as an access card or a bank card, etc.

It is understood that the NFC apparatus may realize data exchange with external NFC apparatuses. In this way, the NFC controller 31 may generate a first current signal based on data to be transmitted. After the first current signal is transmitted through the primary coil 33, the second current signal is generated by the secondary coil 34 through the coupling relationship between the primary coil 33 and the secondary coil 34. The NFC antenna 32 may convert the second current signal into a target electro-magnetic signal and radiate the target electro-magnetic signal, thereby achieving data exchange through the transmission of the target electro-magnetic signal.

In some embodiments, the primary coil 33 and the secondary coil 34 are coils close to each other. When the current in one coil changes, the magnetic flux in the other adjacent coil changes, and an induced electric potential or induced current is generated. In this way, the primary coil 33 and secondary coil 34 transmit data by electro-magnetic induction coupling. In practical applications, a fixed impedance exists for each coil. In the embodiments of the present disclosure, the ratio between the first impedance of the primary coil 33 and the second impedance of the secondary coil 34 is configured to N:1; where N is a real number greater than 1. That is, the ratio between the first impedance and the second impedance is arranged to be greater than 1.

It is understood that when the ratio of the first impedance and the second impedance is N:1, a ratio between a magnitude of the first current signal in the primary coil 33 and a magnitude of the second current signal in the secondary coil 34 may be determined to be $1:\sqrt{N}$, according to the principle of energy conservation.

In this way, in the embodiments of the present disclosure, by configuring the ratio of the first impedance and the second impedance greater than 1, the ratio between the first current in the primary coil 33 and the second current in the secondary coil 34 may be less than 1 according to the principle of energy conservation, which means the second current in the secondary coil 34 is greater than the first current in the primary coil 33, and the effect of boosting the current may be achieved. According to a proportional relationship between magnetic flux and current, when the magnitude of the second current signal is increased, the corresponding magnetic flux generated by the second current will increase, and the performance of the NFC antenna 32 will be improved.

Among them, a relationship between magnetic flux and current may be illustrated by Equation (1).

$$\emptyset = L*I \quad (1)$$

In the Equation (1), Ø is the magnetic flux of the NFC antenna 32, L is the self-inductance of the NFC antenna 32, and /is the magnitude of the second current signal transmitted in the NFC antenna 32.

In the embodiments of the present disclosure, when the self-inductance L of the NFC antenna 32 is constant, the greater the magnitude/of the second current signal is, the greater the magnetic flux of the NFC antenna 32 is, and thus the better the performance of the NFC antenna 32 is.

It should be noted that the self-inductance L of the NFC antenna 32 may be kept constant when the metal environment in which the NFC antenna 32 is located does not change.

Exemplarily, when the ratio between the first impedance of the primary coil 33 and the second impedance of the secondary coil 34 is configured to 1:4, the performance of the NFC antenna 32 may be improved by 2 times compared to the original NFC antenna performance. When the ratio between the first impedance of the primary coil 33 and the second impedance of the secondary coil 34 is configured to 1:9, the performance of the NFC antenna 32 may be improved by 3 times.

It can be seen that the ratio between the first impedance of the primary coil 33 and the second impedance of the secondary coil 34 is configured to N:1 in the NFC apparatus provided in the embodiments of the present disclosure. According to the principle of energy conservation, the magnitude of the second current signal generated by the secondary coil 34 may be enabled to be greater than the magnitude of the first current signal of the primary coil 33, thereby achieving the effect of boosting the current; further, based on the principle that the magnetic flux is proportional to the current, the magnetic flux of the NFC antenna 32 further becomes greater with the current increasing, thereby enhancing the performance of the NFC antenna 32.

In some embodiments of the present disclosure, the ratio between the first impedance of the primary coil and the first impedance of the secondary coil may be configured to N:1 in various ways, and two methods are described in detail below: Method I and Method II.

The following is a brief introduction of Method I.

In a possible implementation, a ratio between a number of first turns of the primary coil 33 and a number of second turns of the secondary coil 34 is configured to N:1.

In this method, the first impedance: second impedance=N:1 may be achieved by configuring the ratio between the number of first turns of the primary coil 33 and the number of second turns of the secondary coil 34 to N:1.

In some embodiments of the present disclosure, the coil may be a wire in the shape of a circle, and the number of turns is the number of turns of wire in the coil around an iron core. The greater the number of turns, the greater the impedance. The number of turns of the primary coil 33 may be configured to be N times the number of turns of the secondary coil 34 to achieve the ratio of the first impedance to the second impedance being N:1.

The following is a brief introduction of Method II.

In another possible implementation, a ratio between a first cross-sectional area of the primary coil 33 and a second cross-sectional area of the secondary coil 34 is configured to 1:N.

In this method, the first impedance: second impedance=N:1 may be achieved by configuring the ratio between the first cross-sectional area of the primary coil 33 and the second cross-sectional area of the secondary coil 34 to 1:N.

In some embodiments of the present disclosure, when the primary coil 33 and the secondary coil 34 are formed by the same material and the same length of wire, the ratio of the first impedance to the second impedance may be configured to be N:1 by configuring the first cross-sectional area of the wire in the primary coil 33 to the second cross-sectional area of the wire in the secondary coil 34 to be 1:N, based on the fact that the impedance of the coil wire is inversely proportional to the cross-sectional area of the coil wire.

In this method, a relationship between the impedance and cross-sectional area of the coil wires may be illustrated by Equation (2).

$$R = \frac{\rho \times K}{S} \quad (2)$$

In the Equation (2), ρ is the resistivity of the wire in the coil, K is the length of the wire in the coil, and S is the cross-sectional area of the wire. From the Equation (2), it can be seen that assuming that the primary coil 33 and secondary coil 34 are formed by the same material and the same length of wire, when the first cross-sectional area: second cross-sectional area=1:N, the first impedance: second impedance=N:1.

Figure 4:
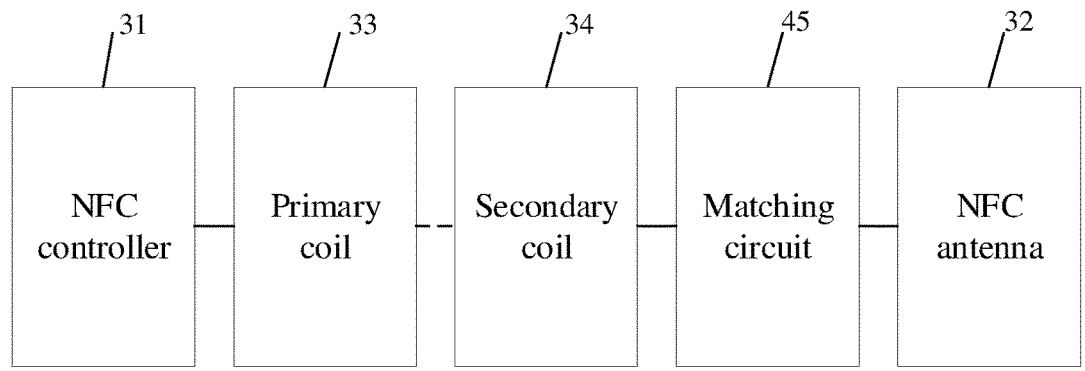
FIG. 4 is a second schematic view of a structural composition of an NFC apparatus according to some embodiments of the present disclosure.

In some embodiments of the present disclosure, referring to FIG. 4, FIG. 4 is a second schematic view of a structural composition of an NFC apparatus according to some embodiments of the present disclosure. The NFC apparatus provided in the embodiments of the present disclosure further includes a matching circuit 45.

In some embodiments of the present disclosure, the matching circuit 45 is arranged between the secondary coil 34 and the NFC antenna 32. The matching circuit 45 is configured to tune the NFC antenna 32 to obtain the target electro-magnetic signal with a specific frequency based on the second current signal.

In practical applications, the NFC antenna 32 may be equivalent to an inductor. In some embodiments of present application, the matching circuit 45 may tune the NFC antenna 32, enabling the NFC antenna 32 to be tuned to resonate at a specific frequency. For example, the specific frequency may be 13.56 MHz.

In some embodiments of the present disclosure, the design solutions of the NFC apparatus may include a differential design solution and a single-ended design solution based on a balanced to unbalanced method. The differential design solution and the balanced-to-unbalanced single-ended design solution are described below, respectively.

The following is a brief introduction of differential design solution.

Figure 5:
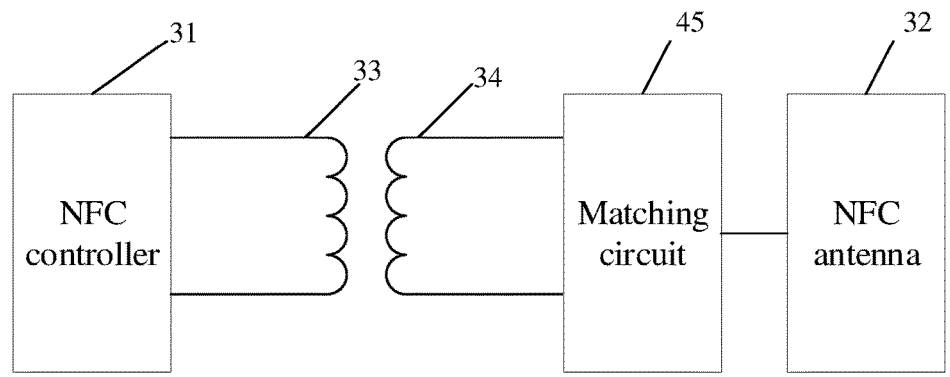
FIG. 5 is a third schematic view of a structural composition of an NFC apparatus according to some embodiments of the present disclosure.

Referring to FIG. 5, FIG. 5 is a third schematic view of a structural composition of an NFC apparatus according to some embodiments of the present disclosure. A first end of the secondary coil 34 is connected to a first connection end of the matching circuit 45; a second end of the secondary coil 34 is connected to a second connection end of the matching circuit 45; and a third connection end of the matching circuit 45 is connected to the NFC antenna 32.

The first current signal generated by the NFC controller 31 is a pair of differential signals. The NFC controller 31 transmits the pair of differential signals to the primary coil 33 and is coupled to the secondary coil 34 through the primary coil 33. An impedance ratio between the primary coil 33 and the secondary coil 34 is N:1. After the differential signal is coupled, its current magnitude will be amplified to obtain the second current signal. The second current signal obtained by the differential solution is also a pair of differential signals, and the secondary coil 34 may transmit the pair of current-amplified differential signals to the matching circuit 45 through the first connection end and the second connection end, respectively. Further, the matching circuit 45 transmits the pair of current-amplified differential signals to the NFC antenna 32. Finally, the NFC antenna 32 converts the pair of current-amplified differential signals into the target electromagnetic signal.

In other words, the first connection end of the matching circuit 45 may transmit a first subdifferential signal of the current-amplified pair of differential signals, and the second connection end of the matching circuit 45 may transmit the second subdifferential signal of the current-amplified pair of differential signals. That is, both wires of the matching circuit 45 transmit signals. It is noted that the first subdifferential signal and the second subdifferential signal of the pair of differential signals have the same amplitude and opposite phase.

In some embodiments of the present disclosure, there are various ways of connecting the matching circuits in the NFC apparatus based on the differential design solution. The following two circuit connection ways are described in detail below, as detailed in Way I and Way II.

The following is a brief introduction of Way I.

Figure 6A:
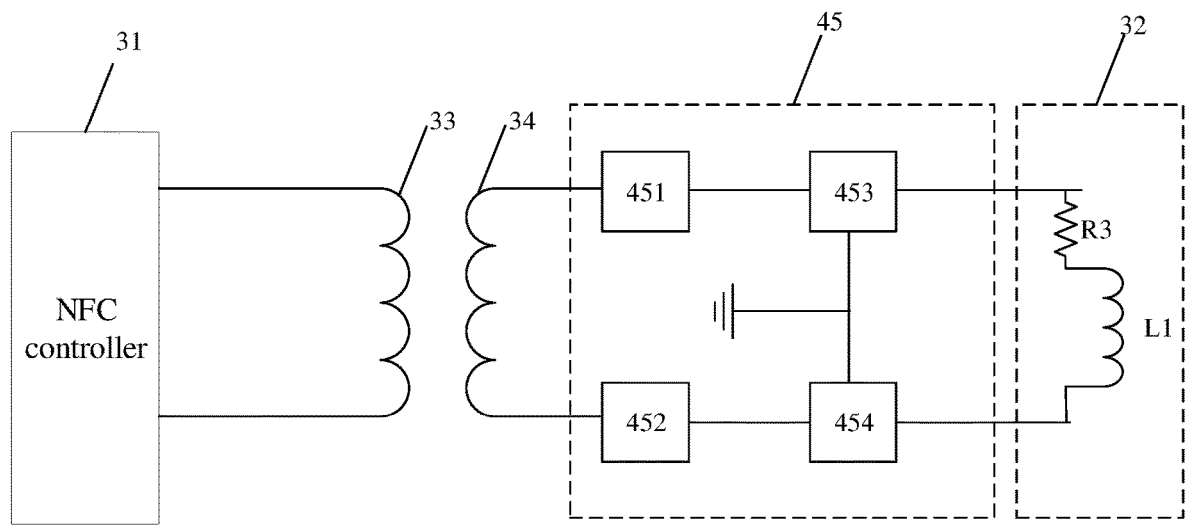
FIG. 6A is a fourth schematic view of a structural composition of an NFC apparatus according to some embodiments of the present disclosure.

Referring to FIG. 6A, FIG. 6A is a fourth schematic view of a structural composition of an NFC apparatus according to some embodiments of the present disclosure. The matching circuit 45 includes: a first circuit module 451, a second circuit module 452, a third circuit module 453, and a fourth circuit module 454.

A first end of the first circuit module 451 constitutes the first connection end of the matching circuit 45, which means the first end of the first circuit module 451 is connected to the first end of the secondary coil 34.

In addition, a second end of the first circuit module 451 is connected to a first end of the third circuit module 453; the first circuit module 451 may include at least two first capacitors connected in parallel.

A first end of the second circuit module 452 constitutes the second connection end of the matching circuit 45, which means the second circuit module 452 is connected to the second end of the secondary coil 34.

A second end of the second circuit module 452 is connected to a first end of the fourth circuit module 454; the second circuit module may include at least two second capacitors connected in parallel.

A second end of the third circuit module 453 and a second end of the fourth circuit module 454 constitute the third connection end of the matching circuit 45; a third end of the third circuit module 453 and a third end of the fourth circuit module 454 are co-grounded.

The third circuit module 453 may include at least two third capacitors connected in parallel and a first resistor connected in series with the at least two third capacitors. The fourth circuit module may include at least two fourth capacitors connected in parallel and a second resistor connected in series with the at least two fourth capacitors.

In the Way I, the NFC antenna 32 includes a third resistor R3 and a first inductor L1. The second end of the third circuit module 453 is connected to a first end of the third resistor R3; the second end of the fourth circuit module 454 is connected to a first end of the first inductor L1; and a second end of the third resistor R3 is connected to a second end of the first inductor L1.

Figure 6B:
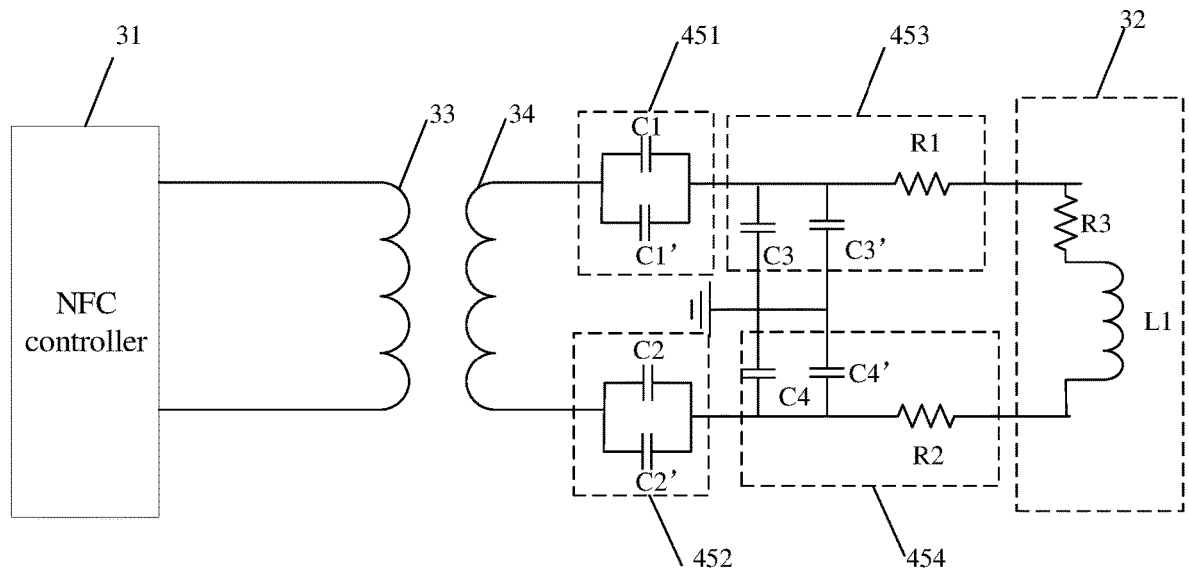
FIG. 6B is a fifth schematic view of a structural composition of an NFC apparatus according to some embodiments of the present disclosure.

Exemplarily, referring to FIG. 6B, FIG. 6B is a fifth schematic view of a structural composition of an NFC apparatus according to some embodiments of the present disclosure. In the Way I, the first circuit module 451 in the matching circuit 45 may include two first capacitors: C1 and C1'. The second circuit module 452 may include two second capacitors: C2 and C2'. The third circuit module 453 may include two third capacitors: C3 and C3', and a first resistor R1. The fourth circuit module 454 may include two fourth capacitors in parallel: C4 and C4', and a second resistor R2. Further, the first resistor R1 is connected to the third resistor R3, and the second resistor R2 is connected to the first inductor L1.

The following is a brief introduction of Way II.

Way II is similar to the connection of the matching circuit in the Way I, and also includes a first circuit module, a second circuit module, a third circuit module, and a fourth circuit module, which will not be repeated herein.

Figure 7A:
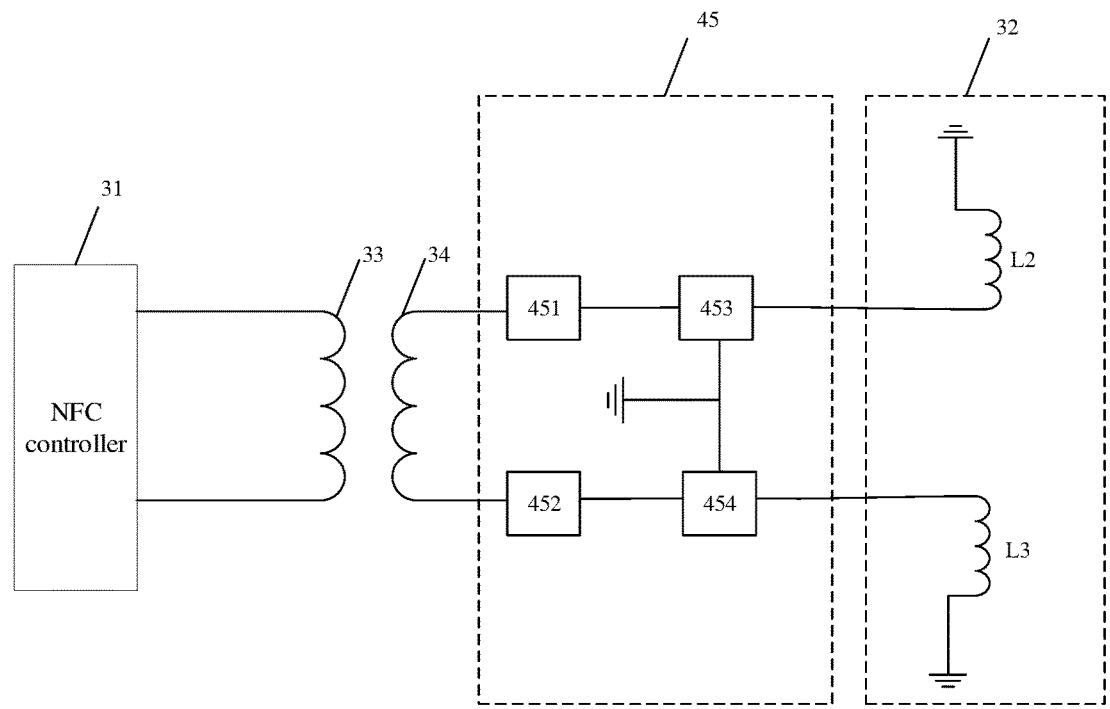
FIG. 7A is a sixth schematic view of a structural composition of an NFC apparatus according to some embodiments of the present disclosure.

In the Way II, referring to FIG. 7A, FIG. 7A is a sixth schematic view of a structural composition of an NFC apparatus according to some embodiments of the present disclosure. The NFC antenna 32 includes a second inductor L2 and a third inductor L3. The second end of the third circuit module 453 is connected to a first end of the second inductor L2. The second end of the fourth circuit module 454 is connected to a first end of the third inductor L3. A second end of the second inductor L2 and a second end of the third inductor L3 are each grounded.

Figure 7B:
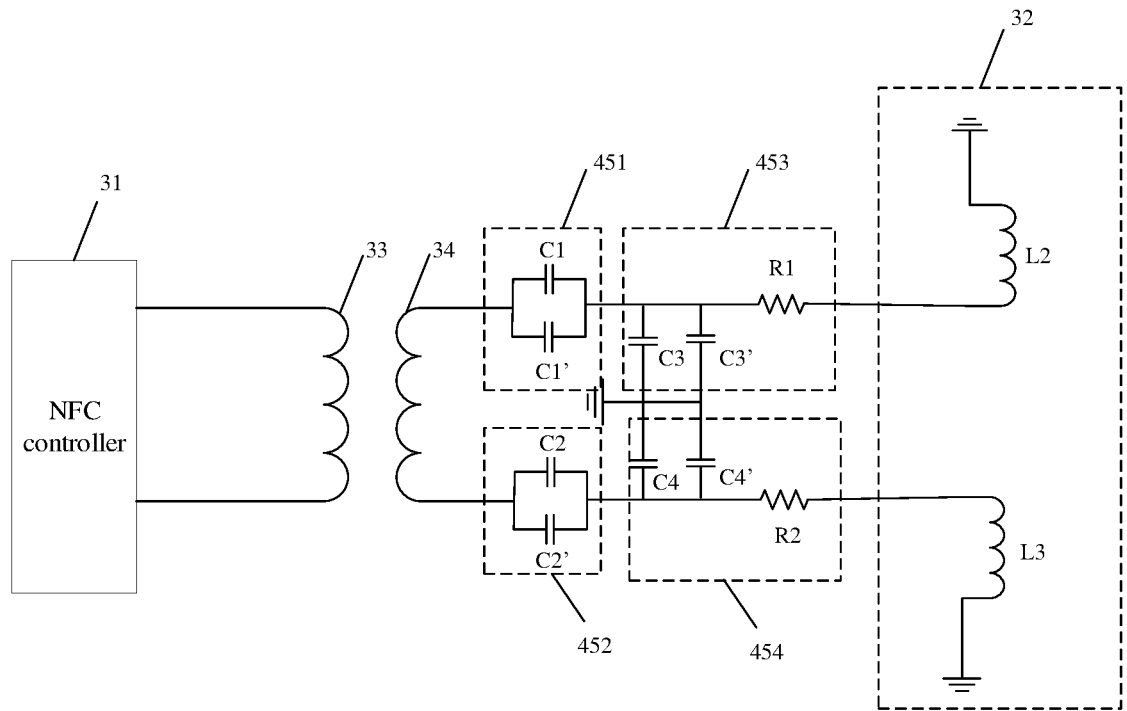
FIG. 7B is a seventh schematic view of a structural composition of an NFC apparatus according to some embodiments of the present disclosure.

Exemplarily, referring to FIG. 7B, FIG. 7B is a seventh schematic view of a structural composition of an NFC apparatus according to some embodiments of the present disclosure. In the Way II, the first circuit module 451 of the matching circuit 45 may include two first capacitors: C1 and C1'. The second circuit module 452 may include two second capacitors: C2 and C2'. The third circuit module 453 may include two third capacitors: C3 and C3', and a first resistor R1. The fourth circuit module 454 may include two fourth capacitors in parallel: C4 and C4', and a second resistor R2. Moreover, the first resistor R1 is connected to the second inductor L2, and the second resistor R2 is connected to the third inductor L3.

It is to be noted that the circuit structure described in FIG. 6A, FIG. 6B, FIG. 7A or FIG. 7B allows the transmission of a pair of differential signals output from the NFC controller 31 to the NFC antenna 32, where the first impedance of the primary coil 33 and the second impedance of the secondary coil 34 are configured at a ratio of N:1 to enhance the antenna performance of the NFC apparatus by boosting the current.

The following is a brief introduction of single-ended design solution based on a balanced to unbalanced method.

In some embodiments of the present disclosure, considering the problem of large space occupied by the antenna and higher cost of the antenna in the differential design solution, the pair of differential signals output from the NFC controller may be converted to a single-ended signal by a balanced-to-unbalanced converter (e.g., a differential-to-single-ended converter).

The balanced-to-unbalanced converter may include the primary coil 33 and the secondary coil 34, which means the primary coil 33 and the secondary coil 34 may form a balanced-to-unbalanced converter.

Figure 8:
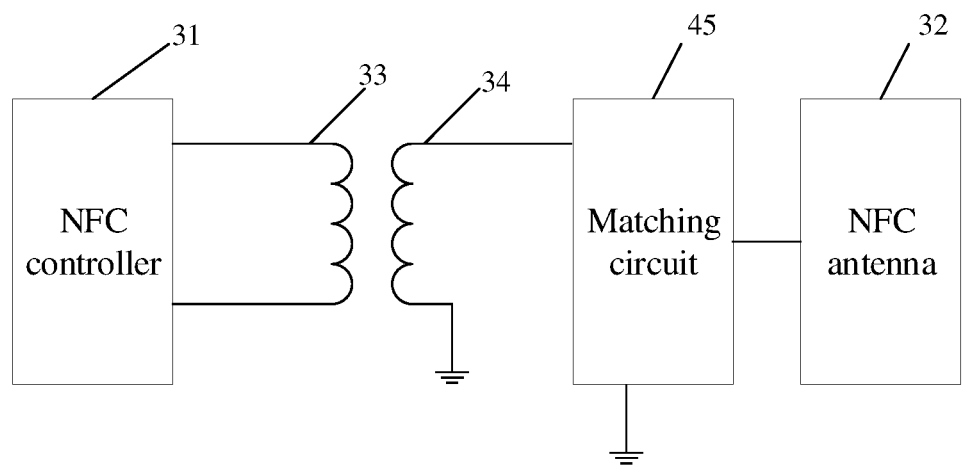
FIG. 8 is an eighth schematic view of a structural composition of an NFC apparatus according to some embodiments of the present disclosure.

Referring to FIG. 8, FIG. 8 is an eighth schematic view of a structural composition of an NFC apparatus according to some embodiments of the present disclosure. The first end of the secondary coil 34 is connected to the first connection end of the matching circuit 45. The second end of the secondary coil 34 is grounded. The second connection end of the matching circuit 45 is grounded. The third connection end of the matching circuit 45 is connected to the NFC antenna 32.

The first current signal is a pair of differential signals. The NFC apparatus converts the pair of differential signals in the first current signal to obtain the second current signal through the coupling relationship between the primary coil 33 and the secondary coil 34. In some embodiments of the present disclosure, the second current signal is a single-ended signal.

In some embodiments of the present disclosure, the pair of differential signals output from the NFC controller 31 is converted to a single-way output signal by a balanced-to-unbalanced converter (primary coil 33 and secondary coil 34). Alternatively, the received single-way output signal is converted, through a balanced-to-unbalanced converter, into a two-way signal to obtain a pair of differential signals for processing by the NFC controller 31.

The circuit connections of the balanced-to-unbalanced based single-ended design solution are described in detail below.

Figure 9A:
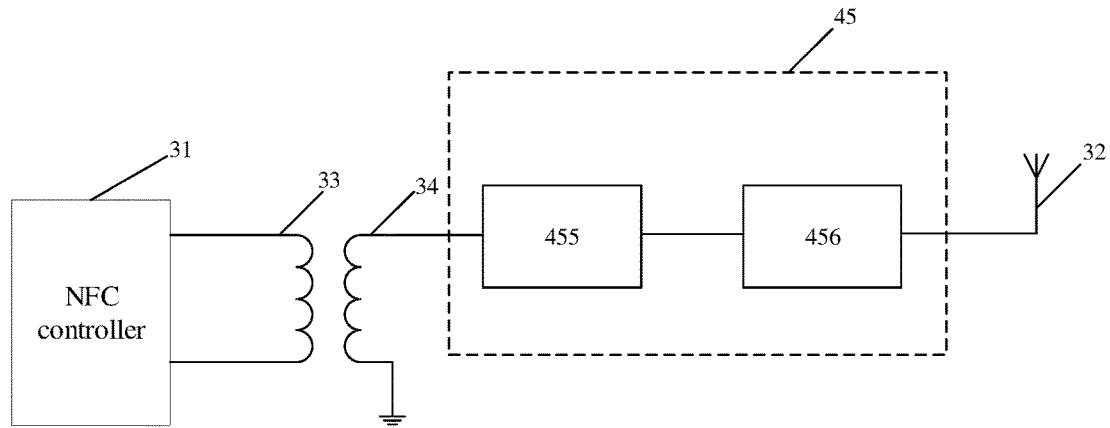
FIG. 9A is a ninth schematic view of a structural composition of an NFC apparatus according to some embodiments of the present disclosure.

Referring FIG. 9A, FIG. 9A is a ninth schematic view of a structural composition of an NFC apparatus according to some embodiments of the present disclosure. The matching circuit 45 includes: a fifth circuit module 455 and a sixth circuit module 456.

A first end of the fifth circuit module 455 constitutes the first connection end of the matching circuit 45, which means the first end of the fifth circuit module 455 is connected to the first end of the secondary coil 34. The fifth circuit module 455 and the sixth circuit module 456 are connected in series, which means a second end of the fifth circuit module 455 is connected to a first end of the sixth circuit module 456.

A second end of the sixth circuit module 456 constitutes the third connection end of the matching circuit 45, which means the second end of the sixth circuit module 456 is connected to the NFC antenna 32.

In some embodiment of the present disclosure, the fifth circuit module 455 may include at least two fifth capacitors connected in parallel. The sixth circuit module may include at least two branches connected in parallel, and each of the at least two branches may include at least two sixth capacitors connected in series.

Figure 9B:
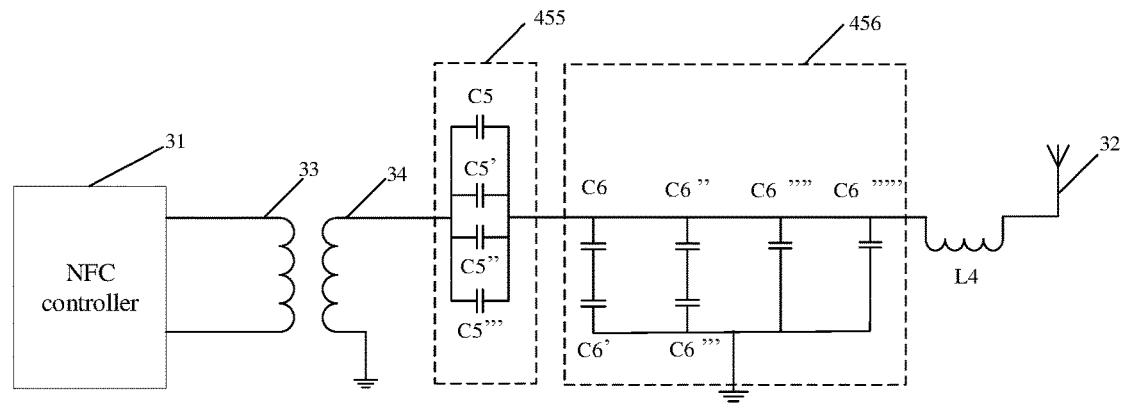
FIG. 9B is a tenth schematic view of a structural composition of an NFC apparatus according to some embodiments of the present disclosure.

Exemplarily, referring to FIG. 9B, FIG. 9B is a tenth schematic view of a structural composition of an NFC apparatus according to some embodiments of the present disclosure. The fifth circuit module 455 may include four fifth capacitors connected in parallel: C5, C5', C5", C5"'. The sixth circuit module may include four branches connected in parallel. The first branch includes two sixth capacitors C6 and C6' connected in series; the second branch includes two sixth capacitors C6" and C6"' connected in series; the third branch includes a sixth capacitor C6"" and, the fourth branch includes a sixth capacitor C6""'. In FIG. 9B, the NFC apparatus may further include an inductor L' connected between the sixth circuit module 456 and the NFC antenna 32 for isolating the matching circuit 45 and the NFC antenna 32.

It should be noted that the circuit described in FIG. 9A or FIG. 9B allows converting a pair of differential signals output from the NFC controller 31 to a single-ended signal through the primary coil 33 and the secondary coil 34. The ratio of the first impedance of the primary coil 33 to the second impedance of the secondary coil 34 is configured to N:1, so that the area of the antenna is reduced through a circuit conversion while the antenna performance of NFC is improved through a boost current.

Figure 10:
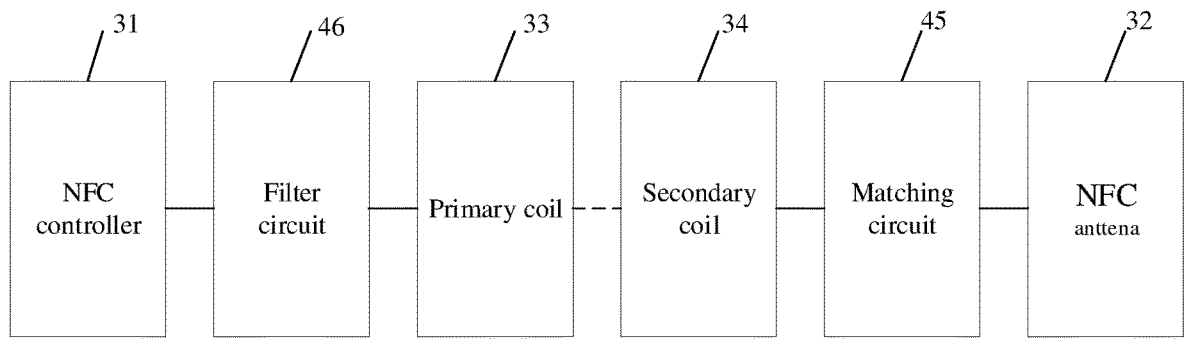
FIG. 10 is an eleventh schematic view of a structural composition of an NFC apparatus according to some embodiments of the present disclosure.

Based on the embodiments mentioned above, referring to FIG. 10, FIG. 10 is an eleventh schematic view of a structural composition of an NFC apparatus according to some embodiments of the present disclosure. The NFC apparatus provided may further include: a filter circuit 46.

The filter circuit 46 is arranged between the NFC controller 31 and the primary coil 33.

The filter circuit is configured to filter signals in the circuit.

It should be noted that the filter circuit 46 may be included in all of the circuit structures shown in FIGS. 6 to 9. The circuit connection based on FIG. 9B is illustrated as an example below.

Figure 11:
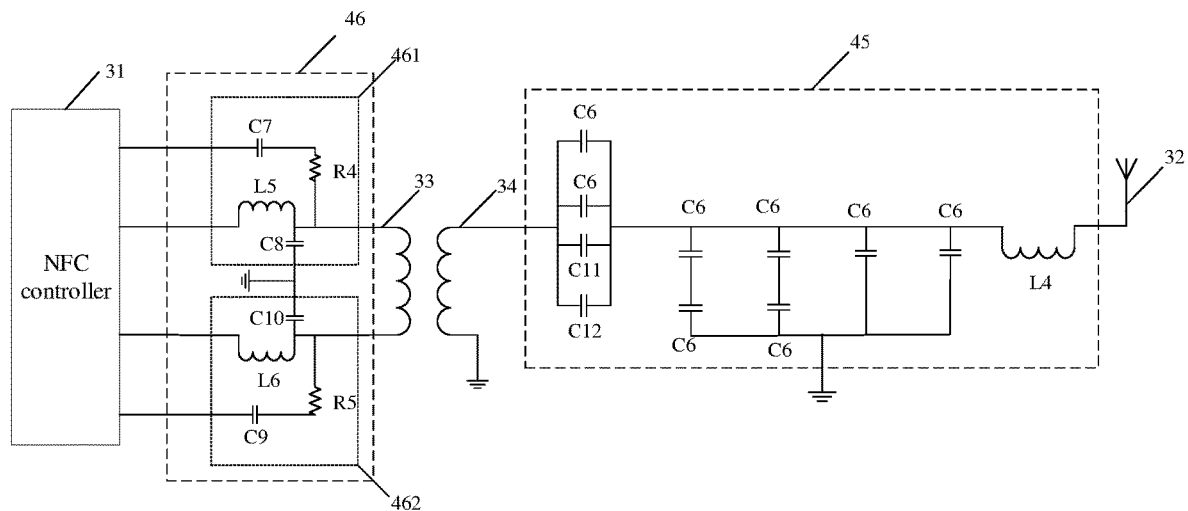
FIG. 11 is a twelfth schematic view of a structural composition of an NFC apparatus according to some embodiments of the present disclosure.

Referring to FIG. 11, FIG. 11 is a twelfth schematic view of a structural composition of an NFC apparatus according to some embodiments of the present disclosure. The filter circuit 46 includes: a seventh circuit module 461 and an eighth circuit module 462.

A first end and a second end of the seventh circuit module 461 are each connected to the NFC controller 31. A third end of the seventh circuit module 461 is connected to the first end of the primary coil 33. The seventh circuit module 461 may include a fourth resistor R4, a seventh capacitor C7, a fifth inductor L5, and an eighth capacitor C8.

A first end and a second end of the eighth circuit module 462 are each connected to the NFC controller 31. A third end of the eighth circuit module 462 is connected to the second end of the primary coil 33. The eighth circuit module 462 may include a fifth resistor R5, a ninth capacitor C9, a sixth inductor L6, and a tenth capacitor C10.

In some embodiments of the present disclosure, a first end of the seventh capacitor C7, is connected to the first end of the NFC controller 31; and a first end of the fifth inductor L5 is connected to a second end of the NFC controller 31.

A first end of the ninth capacitor C9 is connected to the third end of the NFC controller 31; and a first end of the sixth inductor L6 is connected to a fourth end of the NFC controller 31.

In addition, a second end of the seventh capacitor C7 is connected to a first end of the fourth resistor R4; a second end of the fourth resistor R4, a second end of the fifth inductor L5, and a first end of the eighth capacitor C8 are connected together to the first end of the primary coil 33.

Correspondingly, a second end of the ninth capacitor C9 is connected to a first end of the fifth resistor R5; a second end of the fifth resistor R5, a second end of the sixth inductor L6, and a first end of the tenth capacitor C10, are connected together to the second end of the primary coil 33.

In some embodiments of the present disclosure, the second end of the eighth capacitor C8 and the second end of the tenth capacitor C10 are co-grounded.

In some embodiments of the present disclosure, the filter circuit 46 may be equivalent to a low-pass filter, and the filter circuit 46 may filter out and remove signals with frequencies greater than a preset frequency, to obtain an accurate received signal, thereby improving the accuracy of the received signal. Further, the filter circuit 46 may further achieve the effect of impedance transformation.

It should be noted that in some embodiments of the present disclosure, the NFC antenna 32 may share a radiating body with other antennas (e.g., cellular antenna) in an electronic device, thereby reducing the space occupied by the antennas as well as the cost.

Based on the embodiments mentioned above, in a possible implementation, a ratio between the impedance of the NFC controller 31 and the impedance of the NFC antenna 32 is N:1.

In this case, the impedance of the NFC controller 31 may be understood to be a power impedance of the primary coil 33 and the impedance of the NFC antenna 32 may be understood to be a load impedance of the secondary coil 34. In the embodiments of the present disclosure, the ratio between the power impedance and the load impedance is configured to a value that matches the ratio of the first impedance and the second impedance, which maximizes the energy conversion efficiency of the primary coil and the secondary coil, thereby achieving impedance matching and improving the energy conversion efficiency of the NFC apparatus.

Figure 12:
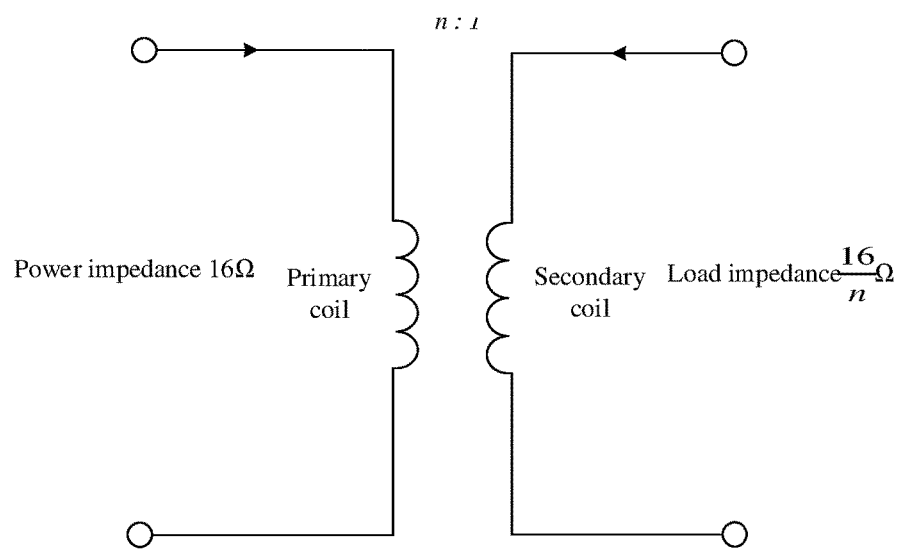
FIG. 12 is a schematic view of an impedance matching according to some embodiments of the present disclosure.

Exemplarily, referring to FIG. 12, FIG. 12 is a schematic view of an impedance matching according to some embodiments of the present disclosure. A ratio of the first impedance of the primary coil 33 to the first impedance of the secondary coil 34 is n:1. When the impedance of the NFC controller 31 (i.e., the power impedance) is 16Ω, in order to achieve impedance matching and maximize the energy conversion efficiency of the primary coil and the secondary coil, the impedance of the NFC antenna 32 (i.e., the load impedance) is 16/n Ω.

Based on the embodiments mentioned above, the embodiments of the present disclosure further provide an electronic device, and the electronic device includes an NFC apparatus. In some embodiments of the present disclosure, the electronic device may be a device with NFC function, and the electronic device includes, but is not limited to, a smartphone, a PDA, a personal computer, an in-vehicle terminal, or a wearable device, etc. The type of the electronic device is not limited by embodiment of the present disclosure.

Figure 13:
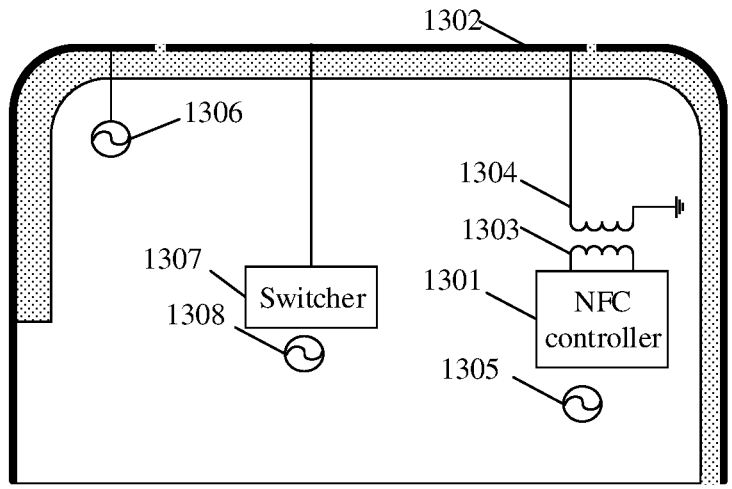
FIG. 13 a schematic view of a structural composition of an electronic device according to some embodiments of the present disclosure.

Referring to FIG. 13, FIG. 13 is a schematic view of a structural composition of an electronic device. The NFC apparatus includes: an NFC controller 1301, an NFC antenna 1302, a primary coil 1303, and a secondary coil 1304.

The NFC controller 1301 is connected to the primary coil 1303; the NFC antenna 1302 is connected to the secondary coil 1304; and the primary coil 1303 is coupled to the secondary coil 1304.

The NFC controller 1301 is configured to control the NFC antenna 1302 to perform a near field communication through a coupling relationship between the primary coil 1303 and the secondary coil 1304.

A ratio between a first impedance of the primary coil 1303 and a second impedance of the secondary coil 1304 is N:1; N is a real number greater than 1.

In some embodiments of the present disclosure, the electronic device may further include a microprocessor. The microprocessor may be connected to the NFC controller 1301. The microprocessor may send control instructions to the NFC apparatus to control the NFC controller 1301 to perform a near field communication.

Further, in some embodiments of the present disclosure, the electronic device further includes a first power supply 1305 and a second power supply 1306. The first powers supply 1305 is configured to power the NFC controller 1301. The second powers supply 1306 is configured to power the NFC antenna 1302.

In some embodiments of the present disclosure, the NFC antenna has the same antenna structure as a long-range communication antenna of the electronic device. It can be understood that the NFC antenna 1302 may share a radiating body with other antennas (e.g., cellular antenna) in the electronic device, thereby reducing the space occupied by the antenna as well as the cost.

In this case, the electronic device may further include a switcher 1307 and a third power supply 1308. The switcher 1307 is configured to switch an operating frequency of the NFC antenna 1302. For example, when a near field communication is required, the frequency of the NFC antenna 1302 is switched to 13.56 MHz by the switcher 1307; when a cellular communication is required, the frequency of the NFC antenna 1302 is switched to the frequency of the cellular communication by the switcher 1307. In addition, the third power supply 1308 is configured to provide electrical support to the switcher 1307.

In some embodiments, a ratio between the magnitude of the first current signal and the magnitude of the second current signal is $1:\sqrt{N}$.

In some embodiments, the NFC apparatus further includes: a matching circuit; the matching circuit is arranged between the secondary coil 1304 and the NFC antenna 1302. The matching circuit is configured to tune the NFC antenna 1302 to obtain the target electro-magnetic signal with a specific frequency based on the second current signal.

In some embodiments, the NFC apparatus further includes: a filtering circuit for filtering signals in the circuit.

The filter circuit may be arranged between the NFC controller 1301 and the primary coil 1303.

In some embodiments, a ratio between the impedance of the NFC controller 1301 and the impedance of the NFC antenna 1302 is N:1.

It should be noted that the description of the electronic device in the embodiments is similar to the description of the NFC apparatus in the embodiments mentioned above and has similar beneficial effects as the NFC apparatus in the embodiments mentioned above, which will not be repeated herein. For technical details not disclosed in the electronic device in the embodiments of the present disclosure, reference may be made to the description of the NFC apparatus in the embodiments described above in the present disclosure.

Figure 14:
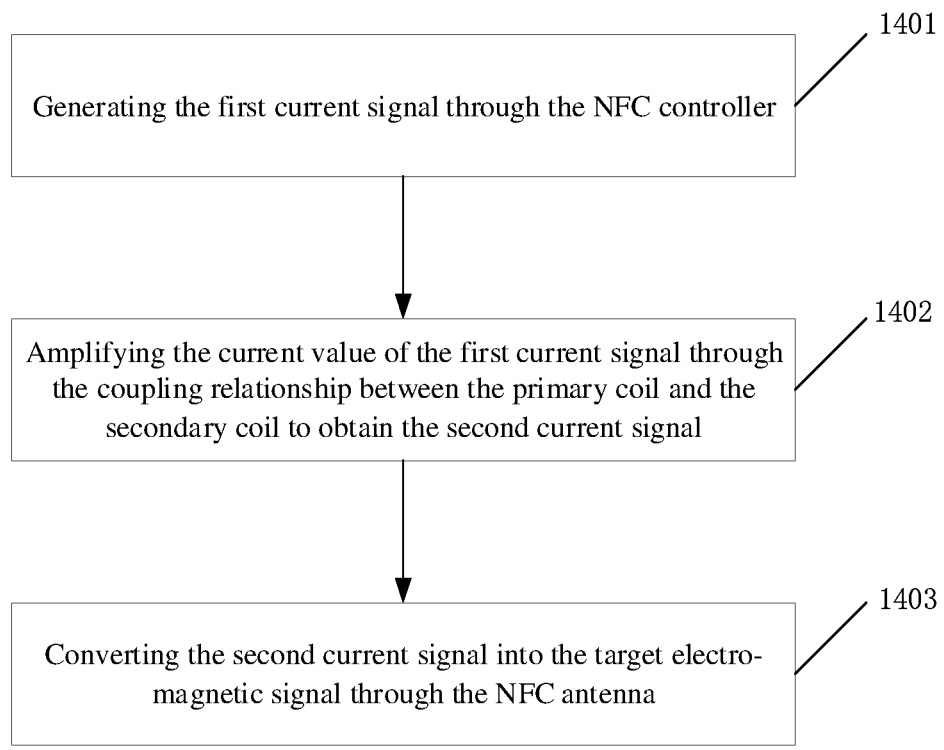
FIG. 14 is a flow chart of a signal processing method according to some embodiments of the present disclosure.

Based on the embodiments mentioned above, the embodiments of the present disclosure further provide a signal processing method which may be applied to the NFC apparatus provided in the above embodiments. Referring to FIG. 14, FIG. 14 is a flow chart of a signal processing method according to some embodiments of the present disclosure. The method includes operations at blocks illustrated herein.

Step 1401, generating the first current signal through the NFC controller.

Step 1402, amplifying the magnitude of the first current signal through the coupling relationship between the primary coil and the secondary coil to obtain the second current signal.

Step 1403, converting the second current signal into the target electro-magnetic signal through the NFC antenna.

It can be understood that in some embodiments of the present disclosure, by configuring the ratio between the first impedance and the second impedance to N:1, it is possible to enable the current magnitude of the secondary coil to be $\sqrt{N}$ times of the current magnitude of the primary coil according to the principle of energy conservation, so that the current magnitude of the secondary coil is greater than the current magnitude of the primary coil, amplifying the magnitude of the first current signal. Further, based on the principle that the magnetic flux is proportional to the current, the magnetic flux of the NFC antenna will further become greater with the current, improving the performance of the NFC antenna.

It should be noted that the description of the signal processing method in the embodiments is similar to the description of the electronic device in the embodiments mentioned above and has similar beneficial effects as the electronic device in the embodiments mentioned above, which will not be repeated herein. For technical details not disclosed in signal processing method in the embodiments of the present disclosure, reference may be made to the description of the NFC apparatus in the embodiments described above in the present disclosure.

It should be noted that the technical solutions recorded in the embodiments of the present disclosure may be combined randomly with each other without conflict.

The above is only some embodiments of the present disclosure, not to limit the scope of the present disclosure. Changes or substitutions within the technical scope disclosed in the present disclosure through easily consideration by those skilled in the art, should be covered by the scope of the present disclosure. Therefore, the scope of the present disclosure shall be subject to the scope of the claims.

The following is a brief introduction of industrial utility of the present disclosure.

The embodiments of the present disclosure provide an NFC apparatus and an electronic device, and a signal processing method. The NFC apparatus includes: an NFC controller, an NFC antenna, a primary coil and a secondary coil. The NFC controller is connected to the primary coil; the NFC antenna is connected to the secondary coil; the primary coil is coupled to the secondary coil; a ratio between a first impedance of the primary coil and a second impedance of the secondary coil is N:1; N is a real number greater than 1. By configuring a ratio between the first impedance and the second impedance to N:1, the embodiments of the present disclosure may enable the current magnitude in the secondary coil to be $\sqrt{N}$ times as the current magnitude in the primary coil according to the principle of energy conservation. In this way, the current magnitude in the secondary coil is greater than the current magnitude in the primary coil, amplifying the magnitude of the first current signal. Further, based on the principle that the magnetic flux is proportional to the current, the magnetic flux of the NFC antenna will further become greater with the current, improving the performance of the NFC antenna.

What is claimed is:

1. A near field communication (NFC) apparatus, comprising:
an NFC controller, configured to generate a first current signal in a form of a pair of differential signals;
an NFC antenna, configured to convert a second current signal in a form of a single-ended signal to a target electro-magnetic signal; and
a balanced-to-unbalanced converter comprising:
a primary coil, connected to the NFC controller; and
a secondary coil, coupled to the primary coil and connected to the NFC antenna;
wherein a ratio between a first impedance of the primary coil and a second impedance of the secondary coil is N:1, and N is a real number greater than 1;
wherein the balanced-to-unbalanced converter is configured to convert the first current signal in the form of a pair of differential signals to the second current signal in the form of a single-ended signal, and amplify a magnitude of the first current signal to a magnitude of the second current signal through a coupling relationship with the ratio between the first impedance of the primary coil and the second impedance of the secondary coil as N:1;
wherein the NFC apparatus further comprises: a matching circuit arranged between the secondary coil and the NFC antenna, wherein the matching circuit is configured to tune the NFC antenna to obtain the target electro-magnetic signal with a specific frequency based on the second current signal;
wherein a first end of the secondary coil is connected to a first connection end of the matching circuit; a second end of the secondary coil is grounded; a second connection end of the matching circuit is grounded; a third connection end of the matching circuit is connected to the NFC antenna; and
wherein the first current signal is a pair of differential signals and the NFC apparatus is configured to convert the pair of differential signals in the first current signal to obtain the second current signal through the coupling relationship between the primary coil and the secondary coil; the second current signal is a single-ended signal.

2. The NFC apparatus according to claim 1, wherein a ratio between the magnitude of the first current signal and the magnitude of the second current signal is 1:$\sqrt{N}$.

3. The NFC apparatus according to claim 1 wherein a ratio between a number of first turns of the primary coil and a number of second turns of the secondary coil is N:1.

4. The NFC apparatus according to claim 1, wherein a ratio between a first cross-sectional area of the primary coil and a second cross-sectional area of the secondary coil is 1:N.

5. The NFC apparatus according to claim 1, wherein a first end of the secondary coil is connected to a first connection end of the matching circuit; a second end of the secondary coil is connected to a second connection end of the matching circuit; a third connection end of the matching circuit is connected to the NFC antenna.

6. The NFC apparatus according to claim 5, wherein the matching circuit comprises: a first circuit module, a second circuit module, a third circuit module, and a fourth circuit module;
   a first end of the first circuit module constitutes the first connection end of the matching circuit; a second end of the first circuit module is connected to a first end of the third circuit module; the first circuit module comprises at least two first capacitors connected in parallel;
   a first end of the second circuit module constitutes the second connection end of the matching circuit; a second end of the second circuit module is connected to a first end of the fourth circuit module; the second circuit module comprises at least two second capacitors connected in parallel; and
   a second end of the third circuit module and a second end of the fourth circuit module constitute the third connection end of the matching circuit; a third end of the third circuit module and a third end of the fourth circuit module are co-grounded; the third circuit module comprises at least two third capacitors connected in parallel and a first resistors connected in series with one of the at least two third capacitors; the fourth circuit module comprises at least two fourth capacitors connected in parallel and the second resistors connected in series with one of the at least two fourth capacitors.

7. The NFC apparatus according to claim 6, wherein the NFC antenna comprises a third resistor and a first inductor; the second end of the third circuit module is connected to a first end of the third resistor; the second end of the fourth circuit module is connected to a first end of the first inductor; and a second end of the third resistor is connected to a second end of the first inductor; or
   the NFC antenna comprises a second inductor and a third inductor; wherein the second end of the third circuit module is connected to a first end of the second inductor; the second end of the fourth circuit module is connected to a first end of the third inductor; and a second end of the second inductor and a second end of the third inductor are grounded.

8. The NFC apparatus according to claim 1, wherein the matching circuit comprises a fifth circuit module and a sixth circuit module;
   wherein a first end of the fifth circuit module constitutes the first connection end of the matching circuit;
   the fifth circuit module and the sixth circuit module are connected in series, and a second end of the sixth circuit module constitutes the third connection end of the matching circuit;
   the fifth circuit module comprises at least two fifth capacitors connected in parallel; and
   the sixth circuit module comprises at least two branches connected in parallel; each of the at least two branches comprise at least two sixth capacitors connected in series.

9. The NFC apparatus according to claim 1, further comprising: a filter circuit for filtering signals in a circuit, wherein the filter circuit is arranged between the NFC controller and the primary coil.

10. The NFC apparatus according to claim 9, wherein the filter circuit comprises:
   a seventh circuit module and an eighth circuit module, wherein
   a first end of the seventh circuit module is connected to the NFC controller; a second end of the seventh circuit module is connected to the NFC controller; a third end of the seventh circuit module is connected to a first end of the primary coil; the seventh circuit module comprises a fourth resistor, a seventh capacitor, a fifth inductor, and an eighth capacitor; and
   a first end of the eighth circuit module is connected to the NFC controller; a second end of the eighth circuit module is connected to the NFC controller; a third end of the eighth circuit module is connected to a second end of the primary coil; the eighth circuit module comprises a fifth resistor, a ninth capacitor, a sixth inductor, and a tenth capacitor.

11. The NFC apparatus according to claim 1, wherein a ratio between an impedance of the NFC controller and an impedance of the NFC antenna is N:1.

12. A signal processing method applied in a near field communication (NFC) apparatus, wherein the NFC apparatus comprises:
   an NFC controller, configured to generate a first current signal in a form of a pair of differential signals;
   an NFC antenna, configured to convert a second current signal in a form of a single-ended signal to a target electro-magnetic signal; and
   a balanced-to-unbalanced converter comprising:
   a primary coil, connected to the NFC controller; and
   a secondary coil, coupled to the primary coil and connected to the NFC antenna;
   wherein a ratio between a first impedance of the primary coil and a second impedance of the secondary coil is N:1, and N is a real number greater than 1;
   wherein the balanced-to-unbalanced converter is configured to convert the first current signal in the form of a pair of differential signals to the second current signal in the form of a single-ended signal, and amplify a magnitude of the first current signal to a magnitude of the second current signal through a coupling relationship with the ratio between the first impedance of the primary coil and the second impedance of the secondary coil as N:1;
   wherein the NFC apparatus further comprises: a matching circuit arranged between the secondary coil and the NFC antenna, wherein the matching circuit is configured to tune the NFC antenna to obtain the target electro-magnetic signal with a specific frequency based on the second current signal;
   wherein a first end of the secondary coil is connected to a first connection end of the matching circuit; a second end of the secondary coil is grounded; a second connection end of the matching circuit is grounded; a third connection end of the matching circuit is connected to the NFC antenna; and
   wherein the first current signal is a pair of differential signals and the NFC apparatus is configured to convert the pair of differential signals in the first current signal to obtain the second current signal through the coupling relationship between the primary coil and the secondary coil; the second current signal is a single-ended signal; and
   the signal processing method further comprising:
   generating, by the NFC controller, the first current signal;
   obtaining a magnitude of the second current signal by amplifying a magnitude of the first current signal through the coupling relationship with the ratio between the first impedance of the primary coil and the second impedance of the secondary coil as N:1 in the balanced-to-unbalanced converter; and converting, by the NFC antenna, the second current signal into the target electro-magnetic signal.

13. An electronic device, comprising a near field communication (NFC) apparatus, wherein the NFC apparatus comprises:
an NFC controller, configured to generate a first current signal in a form of a pair of differential signals;
an NFC antenna, configured to convert a second current signal in a form of a single-ended signal to a target electro-magnetic signal; and
a balanced-to-unbalanced converter comprising:
a primary coil, connected to the NFC controller; and
a secondary coil, coupled to the primary coil and connected to the NFC antenna;
wherein a ratio between a first impedance of the primary coil and a second impedance of the secondary coil is N:1; and N is a real number greater than 1;
wherein the balanced-to-unbalanced converter is configured to convert the first current signal in the form of a pair of differential signals to the second current signal in the form of a single-ended signal, and amplify a magnitude of the first current signal to a magnitude of the second current signal through a coupling relationship with the ratio between the first impedance of the primary coil and the second impedance of the secondary coil as N:1;
wherein the NFC apparatus further comprises: a matching circuit arranged between the secondary coil and the NFC antenna, wherein the matching circuit is configured to tune the NFC antenna to obtain the target electro-magnetic signal with a specific frequency based on the second current signal;
wherein a first end of the secondary coil is connected to a first connection end of the matching circuit; a second end of the secondary coil is grounded; a second connection end of the matching circuit is grounded; a third connection end of the matching circuit is connected to the NFC antenna; and
wherein the first current signal is a pair of differential signals and the NFC apparatus is configured to convert the pair of differential signals in the first current signal to obtain the second current signal through the coupling relationship between the primary coil and the secondary coil, and the second current signal is a single-ended signal.

14. The electronic device according to claim 13, wherein the NFC antenna shares a same antenna structure with a long-range communication antenna of the electronic device.

15. The electronic device according to claim 13, wherein a ratio between a magnitude of a first current signal and a magnitude of a second current signal is $1:\sqrt{N}$.

16. The electronic device according to claim 13, wherein the NFC apparatus further comprises: a matching circuit arranged between the secondary coil and the NFC antenna, wherein the matching circuit is configured to tune the NFC antenna to obtain the target electro-magnetic signal with a specific frequency based on the second current signal.

17. The electronic device according to claim 13, wherein the NFC apparatus further comprises: a filter circuit for filtering signals in a circuit, wherein the filter circuit is arranged between the NFC controller and the primary coil.

18. The electronic device according to claim 13, wherein a ratio between an impedance of the NFC controller and an impedance of the NFC antenna is N:1.

* * * * *